US009385282B2

(12) United States Patent
Setlur et al.

(10) Patent No.: US 9,385,282 B2
(45) Date of Patent: *Jul. 5, 2016

(54) COLOR STABLE RED-EMITTING PHOSPHORS

(71) Applicant: GENERAL ELECTRIC COMPANY, Schenectady, NY (US)

(72) Inventors: Anant Achyut Setlur, Niskayuna, NY (US); James Edward Murphy, Niskayuna, NY (US); Florencio Garcia, Schenectady, NY (US); Ashfaqul Islam Chowdhury, Broadview Heights, OH (US); Srinivas Prasad Sista, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/302,823

(22) Filed: Jun. 12, 2014

(65) Prior Publication Data

US 2015/0364655 A1    Dec. 17, 2015

(51) Int. Cl.
*C09K 11/61* (2006.01)
*H01L 33/50* (2010.01)

(52) U.S. Cl.
CPC ............ *H01L 33/502* (2013.01); *C09K 11/616* (2013.01); *C09K 11/617* (2013.01)

(58) Field of Classification Search
CPC .. C09K 11/616; C09K 11/617; C09K 11/675; C09K 11/628; C09K 11/645; C09K 11/665; C09K 11/0838; C09K 11/02; C09K 11/664; C09K 2211/181; C09K 2211/188; H01L 33/502; H01L 33/504; H01L 33/507; H01L 33/52; H05B 33/14; Y02B 20/181; Y10T 428/2991

USPC ....... 252/301.4 F, 301.4 H, 301.4 R, 301.6 F; 313/486, 503; 362/84, 97.1; 428/403; 257/98

See application file for complete search history.

(56) References Cited

U.S. PATENT DOCUMENTS 2,522,074 A  9/1950  Urbach
3,576,756 A  4/1971  Russo
(Continued)

FOREIGN PATENT DOCUMENTS

CN    102827601 A    12/2012
CN    102851026 A    1/2013
(Continued)

OTHER PUBLICATIONS

Black et al., "Excitation and luminescence spectra of dipotassium hexafluoromanganate(IV)", Journal of the Chemical Society, Royal Society of Chemistry, Dalton Transactions, 1974, 977-981, Issue 9.

(Continued)

*Primary Examiner* — Jonathan Johnson
*Assistant Examiner* — Lynne Edmondson
(74) *Attorney, Agent, or Firm* — Mary Louise Stanford

(57) ABSTRACT

A process for synthesizing a $Mn^{4+}$ doped phosphor includes contacting a precursor of formula I, $$A_x(M_{1-z}Mn_z)F_y \qquad I$$

at an elevated temperature with a fluorine-containing oxidizing agent in gaseous form to form the $Mn^{4+}$ doped phosphor; wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the $[MF_y]$ ion;
y is 5, 6 or 7; and
$0.03 \leq z \leq 0.10$.

14 Claims, 3 Drawing Sheets

(56) References Cited

U.S. PATENT DOCUMENTS

| | | | |
|---|---|---|---|
| 4,479,886 A | | 10/1984 | Kasenga |
| 6,103,296 A | | 8/2000 | McSweeney |
| 7,270,773 B2 | | 9/2007 | Manivannan et al. |
| 7,358,542 B2 | | 4/2008 | Radkov et al. |
| 7,422,703 B2 | | 9/2008 | Yi et al. |
| 7,497,973 B2 | | 3/2009 | Radkov et al. |
| 7,648,649 B2 | | 1/2010 | Radkov et al. |
| 7,847,309 B2 | | 12/2010 | Radkov et al. |
| 8,057,706 B1 | * | 11/2011 | Setlur .................... C09K 11/02 252/301.4 F |
| 8,252,613 B1 | | 8/2012 | Lyons et al. |
| 8,362,685 B2 | | 1/2013 | Masuda et al. |
| 8,427,042 B2 | | 4/2013 | Hata et al. |
| 8,491,816 B2 | | 7/2013 | Hong et al. |
| 8,497,623 B2 | | 7/2013 | Oguma et al. |
| 8,593,062 B2 | | 11/2013 | Murphy et al. |
| 8,703,016 B2 | | 4/2014 | Nammalwar et al. |
| 8,710,487 B2 | * | 4/2014 | Lyons .................. C09K 11/617 257/13 |
| 8,906,724 B2 | * | 12/2014 | Murphy ................ H01L 33/502 438/34 |
| 2009/0001869 A1 | | 1/2009 | Tanimoto et al. |
| 2010/0013373 A1 | * | 1/2010 | Hata .................... H01L 33/504 313/502 |
| 2010/0090585 A1 | | 4/2010 | Seto et al. |
| 2010/0091215 A1 | | 4/2010 | Fukunaga et al. |
| 2011/0069490 A1 | | 3/2011 | Liu |
| 2012/0256125 A1 | | 10/2012 | Kaneyoshi et al. |
| 2012/0305972 A1 | | 12/2012 | Meyer et al. |
| 2013/0241396 A1 | | 9/2013 | Hiramatsu et al. |
| 2013/0264937 A1 | | 10/2013 | Sakuta et al. |
| 2013/0271960 A1 | | 10/2013 | Hong et al. |
| 2015/0069299 A1 | | 3/2015 | Pan et al. |

FOREIGN PATENT DOCUMENTS

| | | |
|---|---|---|
| EP | 1807354 B1 | 11/2008 |
| EP | 2629341 A1 | 8/2013 |
| GB | 1360690 A | 7/1974 |
| JP | 2013-014715 A | 1/2013 |
| JP | 2013-060506 A | 4/2013 |
| WO | 2009005035 A1 | 1/2009 |
| WO | 2009119486 A1 | 10/2009 |
| WO | 2011073951 A2 | 6/2011 |
| WO | 2013088313 A1 | 6/2013 |
| WO | 2013121355 A1 | 8/2013 |
| WO | 2013138347 A1 | 9/2013 |
| WO | 2013144919 A1 | 10/2013 |
| WO | 2013158929 A1 | 10/2013 |
| WO | 2014068440 A1 | 5/2014 |

OTHER PUBLICATIONS

Frayret et al., "Solubility of (NH4)2SiF6, K2SiF6 and Na2SiF6 in acidic solutions", Chemical Physics Letters, Aug. 2006, pp. 356-364, vol. 427, Issue 4.

Paulusz, "Efficient Mn(IV) Emission in Fluorine Coordination", Journal of the Electrochemical Society, Jul. 1973, pp. 942-947, vol. 120, Issue 7.

Liao et al.,"Synthesis of K2SiF6:Mn4+ Phosphor from SiO2 Powders via Redox Reaction in HF/KMnO4 Solution and Their Application in Warm-White LED", Journal of the American Ceramic Society, Wiley online library, Nov. 2013, vol. 96, Issue 11, pp. 3552-3556.

Hu et al., "Preparation and luminescent properties of (Ca1-x,Srx)S:Eu2+ red-emitting phosphor for white LED", Journal of Luminescence, ScienceDirect, Feb. 1, 2005,vol. 111, Issue 3, pp. 139-145.

Kasa et al.,"Red and Deep Red Emissions from Cubic K2SiF6:Mn4+ and Hexagonal K2MnF6 Synthesized in HF/KMnO4/KHF2/Si Solutions", Journal of the Electrochemical Society, ECS, 2012, vol. 159, issue 4, J89-J95.

Murphy et al., "Color Stable Red-Emitting Phosphors", U.S. Appl. No. 14/208,592, filed Mar. 13, 2014.

Murphy et al., "Color Stable Red-Emitting Phosphors", U.S. Appl. No. 14/285,746, filed May 23, 2014.

Nammalwar et al., "Phosphor Materials and Related Devices", U.S. Appl. No. 14/348,244, filed Mar. 28, 2014.

Murphy et al., "Method and System for Storage of Perishable Items", U.S. Appl. No. 13/665,514, filed Oct. 31, 2012.

Brewster et al., "Phosphor Assembly for Light Emitting Devices", U.S. Appl. No. 13/875,534, filed May 2, 2013.

Murphy et al., "Color Stable Red-Emitting Phosphors", U.S. Appl. No. 61/791,511, filed Mar. 15, 2013.

General Electric Company, "Color Stable Red-Emitting Phosphors", PCT Patent Application PCT/US14/027733, filed Mar. 14, 2014.

Murphy, "Processes for Preparing Color Stable Manganese-Doped Phosphors", U.S. Appl. No. 61/868,633, filed Aug. 22, 2013.

Setlur et al., "LED Package With Red-Emitting Phosphors", U.S. Appl. No. 14/073,141, filed Nov. 6, 2013.

Murphy et al., "Processes for Preparing Color Stable Manganese-Doped Complex Fluoride Phosphors", U.S. Appl. No. 61/915,927, filed Dec. 13, 2013.

Bera et al., "Optimization of the Yellow Phosphor Concentration and Layer Thickness for Down-Conversion of Blue to White Light", Journal of Display Technology, pp. 645-651, vol. 6, No. 12, Dec. 2010.

Murphy et al., "Red-Emtting Phosphors and Associated Devices", U.S. Appl. No. 14/303,020, filed Jun. 12, 2014.

Setlur et al., "LED Package With Red-Emitting Phosphors", U.S. Appl. No. 14/304,098, filed Jun. 13, 2014.

Garcia et al., "Color Stable Red-Emitting Phosphors", U.S. Appl. No. 14/302,907, filed Jun. 12, 2014.

Takahashi et al., "Mn4+-Activated Red Photoluminescence in K2SiF6 Phosphor", Journal of the Electrochemical Society, pp. E183-E188, vol. 155, Issue 12, 2008.

International Search Report and Written Opinion dated Jul. 14, 2014 which was issued in connection with PCT Patent Application No. PCT/US2014/027733.

International Search Report and Written Opinion issued in connection with corresponding PCT Application No. PCT/US2015/034938 on Jan. 26, 2016.

International Search Report and Written Opinion issued in connection with PCT Application No. PCT/US2015/060806 on Jan. 28, 2016.

* cited by examiner

COLOR STABLE RED-EMITTING PHOSPHORS

BACKGROUND

Red-emitting phosphors based on complex fluoride materials activated by $Mn^{4+}$, such as those described in U.S. Pat. No. 7,358,542, U.S. Pat. No. 7,497,973, and U.S. Pat. No. 7,648,649, can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

While the efficacy and CRI of lighting systems using $Mn^{4+}$ doped fluoride hosts can be quite high, one potential limitation is their susceptibility to degradation under high temperature and humidity (HTHH) conditions. It is possible to reduce this degradation using post-synthesis processing steps, as described in U.S. Pat. No. 8,252,613. However, further improvement in stability of the materials is desirable.

BRIEF DESCRIPTION

Briefly, in one aspect, the present invention relates to a process for synthesizing a $Mn^{4+}$ doped phosphor. A precursor of formula I is contacted with a fluorine-containing oxidizing agent in gaseous form at an elevated temperature to form the $Mn^{4+}$ doped phosphor

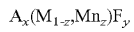   I wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the $[MF_y]$ ion;
y is 5, 6 or 7; and
$0.03 \le z \le 0.10$.

In another aspect, the present invention relates to color stable $Mn^{4+}$ doped phosphors that may be produced by the process, and lighting apparatuses and backlight devices that include the $Mn^{4+}$ doped phosphors.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
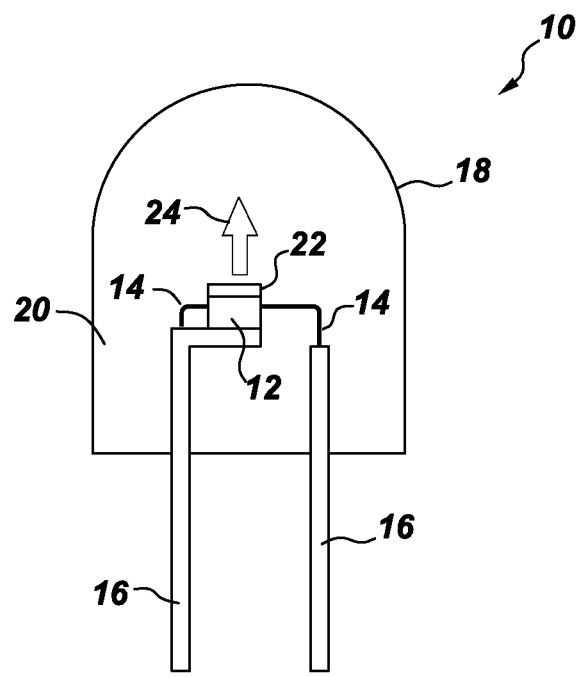
FIG. 1 is a schematic cross-sectional view of a lighting apparatus in accordance with one embodiment of the invention.

In the processes according to the present invention, a non-color stable precursor to a color stable phosphor is annealed, or subjected to an elevated temperature, while in contact with an atmosphere containing a fluorine-containing oxidizing agent. The precursor is a $Mn^{4+}$-doped complex fluoride material of formula I. In the context of the present invention, the term "complex fluoride material or phosphor", means a coordination compound, containing at least one coordination center, surrounded by fluoride ions acting as ligands, and charge-compensated by counter ions as necessary. In one example, $K_2SiF_6:Mn^{4+}$, the coordination center is Si and the counterion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

The amount of manganese in the $Mn^{4+}$ doped precursors and in the phosphors ranges from about 3.0 mol % to about 10 mol %, that is, in formula I, $0.03 \le z \le 0.10$ (0.746 wt %-2.46 wt %, based on total weight of the precursor or phosphor), particularly about 3.5 mol % to about 6 mol % ($0.035 \le z \le 0.060$, or from 0.87 to 1.48 wt %), more particularly from about 3. mol % to about 5.5 mol % ($0.035 \le z \le 0.055$, or from 0.87 wt % to 1.36 wt %), and even more particularly from about 3.5 mol % to about 5.1 mol %, ($0.035 \le z \le 0.0510$, or from 0.87 wt % to 1.26 wt %).

In particular embodiments, the coordination center of the precursor, that is, M in formula I, is Si, Ge, Sn, Ti, Zr, or a combination thereof. More particularly, the coordination center is Si, Ge, Ti, or a combination thereof, and the counterion, or A in formula I, is Na, K, Rb, Cs, or a combination thereof, and y is 6. Examples of precursors of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the precursor of formula I is $K_2SiF_6:Mn^{4+}$.

The temperature at which the precursor is contacted with the fluorine-containing oxidizing agent is any temperature in the range from about 200° C. to about 700° C., particularly from about 350° C. to about 600° C. during contact, and in some embodiments from about 500° C. to about 600° C. In various embodiments of the present invention, the temperature is at least 100° C., particularly at least 225° C., and more particularly at least 350° C. The phosphor precursor is contacted with the oxidizing agent for a period of time sufficient to convert it to a color stable phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours.

After holding at the elevated temperature for the desired period of time, the temperature in the furnace may be reduced at a controlled rate while maintaining the oxidizing atmosphere for an initial cooling period. After the initial cooling period, the cooling rate may be controlled at a the same or different rate, or may be uncontrolled. In some embodiments, the cooling rate is controlled at least until a temperature of 200° C. is reached. In other embodiments, the cooling rate is controlled at least until a temperature at which it is safe to purge the atmosphere is reached. For example, the temperature may be reduced to about 50° C. before a purge of the fluorine atmosphere begins.

Reducing the temperature at a controlled rate of ≤5° C. per minute may yield a phosphor product having superior properties compared to reducing the temperature at a rate of 10° C./minute. In various embodiments, the rate may be controlled at ≤5° C. per minute, particularly at ≤3° C. per minute, more particularly at a rate of ≤1° C. per minute.

The period of time over which the temperature is reduced at the controlled rate is related to the contact temperature and cooling rate. For example, when the contact temperature is 540° C. and the cooling rate is 10° C./minute, the time period for controlling the cooling rate may be less than one hour, after which the temperature may be allowed to fall to the purge or ambient temperature without external control. When the contact temperature is 540° C. and the cooling rate is ≤5° C. per minute, then the cooling time may be less than two hours. When the contact temperature is 540° C. and the cooling rate is ≤3° C. per minute, then the cooling time may be less than three hours. When the contact temperature is 540° C. and the cooling rate is ≤1° C. per minute, then the cooling time is may be less than four hours. For example, the temperature may be reduced to about 200° C. with controlled cooling, then control may be discontinued. After the controlled cooling period, the temperature may fall at a higher or lower rate than the initial controlled rate.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$ or a combination thereof. In particular embodiments, the fluorine-containing oxidizing agent is $F_2$. The amount of oxidizing agent in the atmosphere may be varied to obtain the color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In particular embodiments, the atmosphere is composed of about 20% $F_2$ and about 80% nitrogen.

The manner of contacting the precursor with the fluorine-containing oxidizing agent is not critical and may be accomplished in any way sufficient to convert the precursor to a color stable phosphor having the desired properties. In some embodiments, the chamber containing the precursor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

In another aspect, the present invention relates to a process that includes contacting a precursor at an elevated temperature with a fluorine-containing oxidizing agent in gaseous form to form the color stable $Mn^{4+}$ doped phosphor; the precursor is selected from the group consisting of (A) $A_2[MF_5]:Mn^{4+}$, where A is selected from Li, Na, K, Rb, Cs, and combinations thereof; and where M is selected from Al, Ga, In, and combinations thereof;

(B) $A_3[MF_6]:Mn^{4+}$, where A is selected from Li, Na, K, Rb, Cs, and combinations thereof; and where M is selected from Al, Ga, In, and combinations thereof;

(C) $Zn_2[MF_7]:Mn^{4+}$, where M is selected from Al, Ga, In, and combinations thereof;

(D) $A[In_2F_7]:Mn^{4+}$ where A is selected from Li, Na, K, Rb, Cs, and combinations thereof;

(E) $A_2[MF_6]:Mn^{4+}$, where A is selected from Li, Na, K, Rb, Cs, and combinations thereof; and where M is selected from Ge, Si, Sn, Ti, Zr, and combinations thereof;

(F) $E[MF_6]:Mn^{4+}$, where E is selected from Mg, Ca, Sr, Ba, Zn, and combinations thereof; and where M is selected from Ge, Si, Sn, Ti, Zr, and combinations thereof;

(G) $Ba_{0.65}Zr_{0.35}F_{2.70}:Mn^{4+}$; and (H) $A_3[ZrF_7]:Mn^{4+}$ where A is selected from Li, Na, K, Rb, Cs, and combinations thereof; and the amount of manganese ranges from about 3.0 mol % to about 10 mol %.

The amount of manganese in the $Mn^{4+}$ doped precursors of groups (A)-(H) and in the phosphors ranges from about 3.0 mol % to about 10 mol %, (0.746 wt %-2.46 wt %, based on total weight of the precursor or phosphor, particularly about 3.5 mol % to about 6 mol % (from 0.87 to 1.48 wt %), more particularly from about 3. mol % to about 5.5 mol % (from 0.87 wt % to 1.36 wt %), and even more particularly from about 3.5 mol % to about 5.1 mol %, (from 0.87 wt % to 1.26 wt %). In other embodiments, the amount manganese ranges from 3.5 mol % to about 8.0 mol %. Time, temperature and fluorine-containing oxidizing agents for the process are described above.

Color stability and quantum efficiency of phosphors annealed in a process according to the present invention may be enhanced by treating the phosphor in particulate form with a saturated solution of a composition of formula II $$A_x[MF_y]  \quad\quad\quad\quad\quad II$$

in aqueous hydrofluoric acid, as described in U.S. Pat. No. 8,252,613. The temperature at which the phosphor is contacted with the solution ranges from about 20° C. to about 50° C. The period of time required to produce the color stable phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w. Less concentrated solutions may result in lower yields of the phosphor.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; and $1+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In some embodiments, the encapsulant material 20 is a silicone matrix having an index of refraction R, and, in addition to phosphor composition 22, contains a diluent material having less than about 5% absorbance and index of refraction of R±0.1. The diluent material has an index of refraction of $\leq 1.7$, particularly $\leq 1.6$, and more particularly $\leq 1.5$. In particular embodiments, the diluent material is of formula II, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as LiF, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
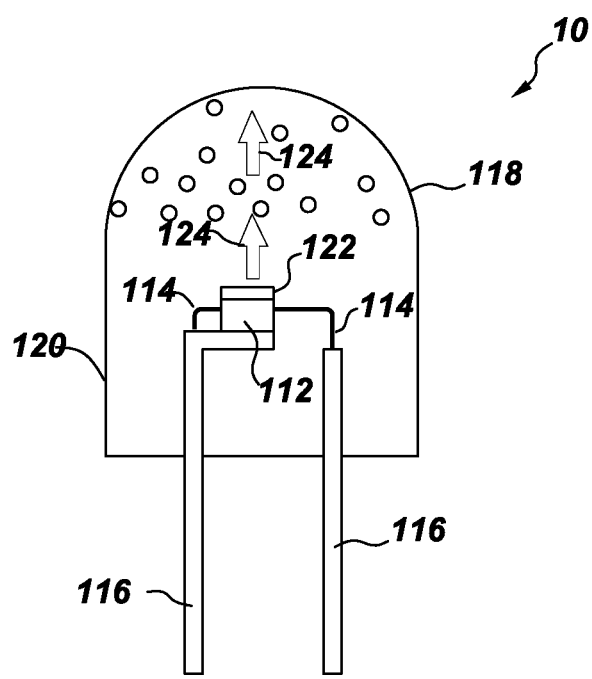
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
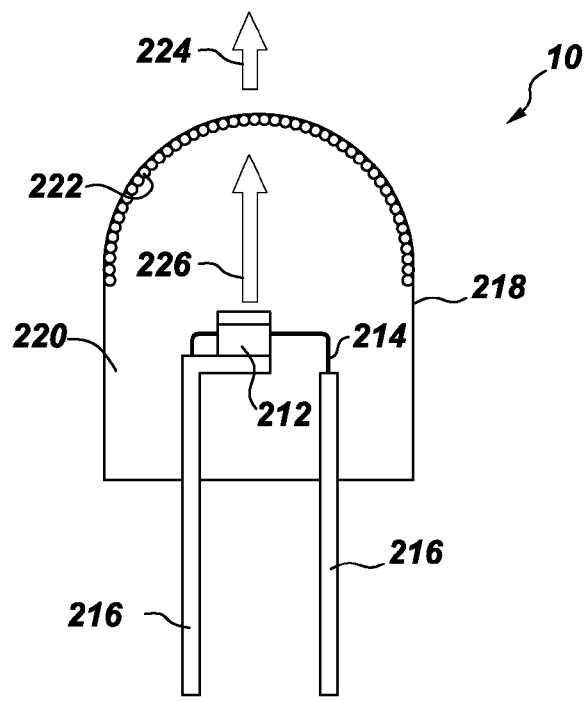
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
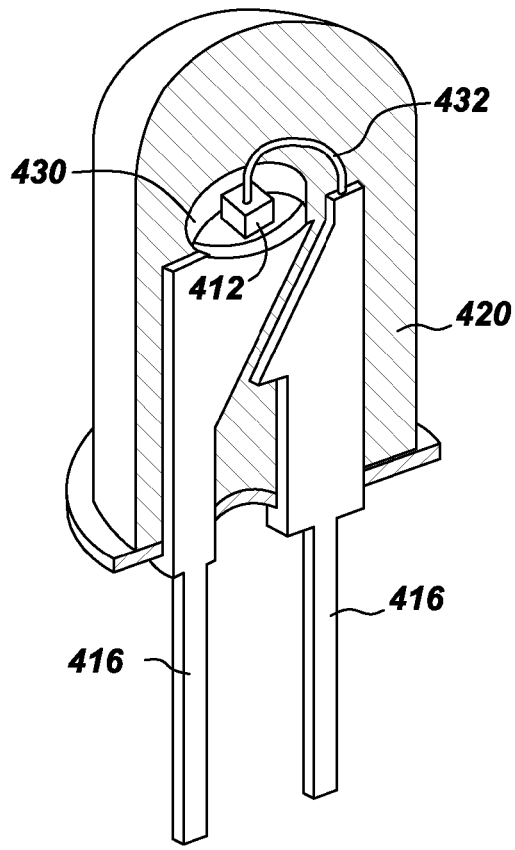
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
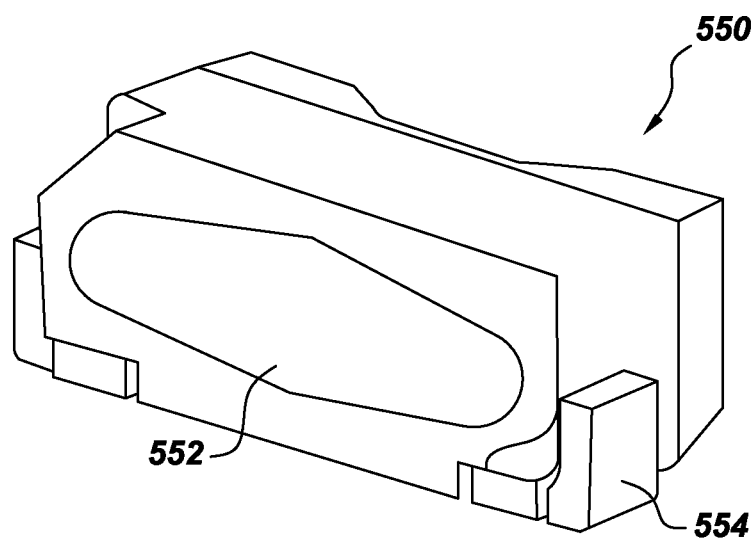
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, smartphones, tablet computers and other handheld devices that have a display including a semiconductor light source; and a color stable $Mn^{4+}$ doped phosphor according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the color stable $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl) diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N, C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to: $((Sr_{1-z}(Ca, Ba, Mg, Zn)_z)_{1-(x+w)}(Li, Na, K, Rb)_w Ce_x)_3(Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$; $(Ca, Ce)_3Sc_2Si_3O_{12}$ (CaSiG); $(Sr,Ca,Ba)_3Al_{1-x}Si_xO_{4+x}F_{1-x}:Ce^{3+}$ (SASOF)); $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $-0.2\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_\beta Si_\gamma N_\mu:Eu^{2+}$ (wherein $2\beta+4\gamma=3\mu$); $(Ba,Sr,Ca)_2Si_{5-x}Al_xN_{8-x}O_x:Eu^{2+}$ (wherein $0\leq x\leq2$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $-0.5\leq u\leq1$, $0<v\leq0.1$, and $0\leq w\leq0.2$); $(Y,Lu,Gd)_{2-\phi}Ca_\phi Si_4N_{6+\phi}C_{1-\phi}:Ce^{3+}$, (wherein $0\leq\phi\leq0.5$); $(Lu,Ca,Li,Mg,Y)$ α-SiAlON doped with $Eu^{2+}$ and/or $Ce^{3+}$; $(Ca,Sr,Ba)SiO_2N_2:Eu^{2+},Ce^{3+}$; β-SiAlON:$Eu^{2+}$,$3.5MgO*0.5MgF_2*GeO_2:Mn^{4+}$; $(Sr,Ca,Ba)AlSiN_3:Eu^{2+}$; $(Sr,Ca,Ba)_3SiO_5:Eu^{2+}$; $Ca_{1-c-f}Ce_cEu_fAl_{1+c}Si_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq0.2$, $0\leq r\leq0.2$); $Ca_{1-2s-t}Ce_s(Li,Na)_sEu_tAlSiN_3$, (where $0\leq s\leq0.2$, $0\leq f\leq0.2$, $s+t>0$); and $Ca_{1-o-\chi-\phi}Ce_o(Li,Na)_\chi Eu_\phi Al_{1+o-\chi}Si_{1-o+\chi}N_3$, (where $0\leq o\leq0.2$, $0\leq\chi\leq0.4$, $0\leq\phi\leq0.2$).

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination. The list of potential phosphor for blending given here is not meant to be exhaustive and these $Mn^{4+}$-doped phosphors can be blended with various phosphors with different emission to achieve desired spectral power distributions.

LED devices incorporating the color stable phosphors and used for backlighting or general illumination lighting may have a color shift of <1.5 MacAdam ellipses over 2,000 hours of device operation, and, in particular embodiments, <1 MacAdam ellipse over 2,000 hours, where the phosphor/polymer composite is in direct contact with the LED chip surface, LED wall plug efficiency greater than 40%, and LED current densities are greater than 2 A/cm². In accelerated testing, where the phosphor/polymer composite is in direct contact with the LED chip surface, LED wall plug efficiency greater than 18%, and LED current densities are greater than 70 A/cm², LED devices may have color shift of <1.5 MacAdam ellipse over 30 minutes.

The color stable $Mn^{4+}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

General Procedures

Silicone Tape Sample Preparation

Samples were prepared by mixing 500 mg of the material to be tested with 1.50 g silicone (Sylgard 184). The mixture was degassed in a vacuum chamber for about 15 minutes. The mixture (0.70 g) was poured into a disc-shaped template (28.7 mm diameter and 0.79 mm thick) and baked for 30 minutes at 90° C. The sample was cut into squares of size approximately 5 mm×5 mm for testing.

Stability Testing

High Light Flux Conditions

A laser diode emitting at 446 nm was coupled to an optical fiber with a collimator at its other end. The power output was 310 mW and the beam diameter at the sample was 700 microns. This is equivalent to a flux of 80 W/cm² on the sample surface. The spectral power distribution (SPD) spectrum that is a combination of the scattered radiation from the laser and the emission from the excited phosphor is collected with a 1 meter (diameter) integrating sphere and the data processed with the spectrometer software (Specwin). At intervals of two minutes, the integrated power from the laser and the phosphor emission were recorded over a period of about 21 hours by integrating the SPD from 400 nm to 500 nm and 550 nm to 700 nm respectively. The first 90 minutes of the measurement are discarded to avoid effects due to the thermal stabilization of the laser. The percentage of intensity loss due to laser damage is calculated as follows:

$$\text{Intensity loss (\%)} = 100 \frac{(\text{Power} - \text{Initial power})}{\text{Initial power}}$$

While only the emitter power from the phosphor is plotted, the integrated power from the laser emission as well as its peak position was monitored to ensure that the laser remained stable (variations of less than 1%) during the experiment.

High Temperature High Humidity (HHTH) Treatment

Samples for high temperature, high humidity (HTHH) treatment were made by mixing phosphor powders into a two-part methyl silicone binder (RTV-615, Momentive Performance Materials) in a ratio of 0.9 g phosphor to 0.825 g silicone (parts A+B). The phosphor/silicone mixture is then poured into aluminum sample holders and cured at 90° C. for 20 minutes. Control samples were stored under nitrogen, and samples for exposure to HTHH conditions were placed into a 85° C./85% RH controlled atmosphere chamber. These HTHH samples are periodically removed and their luminescence intensity under 450 nm excitation compared to that of the control samples.

Examples 1-4

Preparation of $K_2SiF_6:Mn^{4+}$ with Manganese Levels Ranging from 0.91 wt % to 1.19 wt %

Amounts and distribution of starting materials among Beakers A-D are shown in Table 1. For Example 4, 5 mL of acetone was also added to beaker B. Procedure: Beaker A was stirred aggressively, and the contents of beaker B were added dropwise at a rate of 75 mL/min for 30 seconds and then 60 mL/min for the remainder of the reaction. The contents of beaker D were added dropwise to beaker A at a rate of 13 mL/minute 20 seconds after the contents of beaker B began to be added. The contents of beaker C were added dropwise to beaker A at a rate of 13 mL/minute 30 seconds after the contents of beaker B began to be added. The precipitate was digested for 5 minutes and the stirring was stopped. The supernatant was decanted, and the precipitate was vacuum filtered, rinsed once with acetic acid and twice with acetone, and then dried under vacuum. The dried powder was sifted through 44 micron mesh, and annealed under 20% $F_2$ for 8 hr. at 540° C. The annealed phosphor was washed in a solution of 49% HF saturated with $K_2SiF_6$, dried under vacuum and sifted.

TABLE 1

| Source | KF (g) | $K_2MnF_6$ (g) | 35% $H_2SiF_6$ (mL) | 49% HF (mL) |
|---|---|---|---|---|
| Example 1: 0.91% Mn | | | | |
| Beaker A | 19 g | 1.19 | | 100 |
| Beaker B | | | 47.3 | 150 |
| Beaker C | | 1.45 | | 25 |
| Beaker D | 8.9 | | | 20 |
| Example 2: 1.19% Mn | | | | |
| Beaker A | 19 | 0.88 | | 90 |
| Beaker B | | | 46.8 | 148 |
| Beaker C | | 2.04 | | 35 |
| Beaker D | 8.9 | | | 20 |
| Example 3: 1.17% Mn | | | | |
| Beaker A | 14 | 0.88 | | 85 |
| Beaker B | | | 46.6 | 147 |
| Beaker C | | 2.0 | | 30 |
| Beaker D | 14 | | | 28 |
| Example 4: 0.94% Mn | | | | |
| Beaker A | 10 | 0.88 | | 80 |
| Beaker B | | | 46.6 | 147 |
| Beaker C | | 2.0 | | 30 |
| Beaker D | 14 | | | 28 |

Samples were evaluated for laser damage, quantum efficiency (QE, reported as relative QE, setting the value of QE of the commercial control containing to 100%) and absorbance at 450 nm. The amount of manganese was determined by inductively coupled plasma mass spectrometry (ICP-MS). Results are shown in Table 2. It can be seen that laser damage was lower, and QE and absorbance were higher compared to the control sample which was Mn-doped $K_2SiF_6$ obtained from a commercial source.

TABLE 2

| Example No. | Laser Damage | QE (relative) | Abs 450 nm | wt % Mn |
|---|---|---|---|---|
| Control | 7.2% | 100.0% | 68.8% | 0.73% |
| 18 | 1.0% | 103.0% | 74.0% | 0.91% |
| 19 | 2.7% | 103.6% | 80.1% | 1.19% |
| 20 | 1.3% | 101.6% | 75.3% | 1.17% |
| 21 | 1.5% | 103.3% | 73.0% | 0.94% |

Comparative Example 1

Mn-doped potassium fluorosilicate, containing 0.84 wt % Mn, based on total weight of the material, was annealed I a furnace at 540° C. in 10 psia of 20% $F_2$/80% $N_2$ for 8 hours. The annealed phosphor was washed in a solution of 49% HF saturated with $K_2SiF_6$, dried under vacuum and sifted. The phosphor and an annealed, untreated commercial sample were tested under conditions of high light flux. Results are shown in Table 3.

TABLE 3

| Example No. | Laser Damage | QE (Relative) | % Mn | Conditions |
|---|---|---|---|---|
| Control | 10.9% | 100 | 0.84% | No treatment |
| Comp. Ex. 1 | 1.5% | 107.5 | 0.82% | 540° C. in 10 psia of 20% $F_2$/80% $N_2$ for 8 hours |

Examples 4 and 5

Properties of $K_2SiF_6$:$Mn^{4+}$ with 0.9 wt % and 1.25 wt % Manganese

Mn-doped potassium fluorosilicate samples were prepared and treated as in Examples 1-4. Quantum efficiency and decay time were measured and weight % Mn was determined by ICP-MS, before and after treatment. Results are shown in Table 4. It can be seen that the quantum efficiency of high Mn samples was improved, the onset/effects of concentration quenching were reduced. The improvement in QE at least is significantly greater than that observed at lower Mn levels. For example, QE of the phosphor of Comparative Example 1, having 0.84 wt % Mn, increased from 100 (relative) to 107 (relative), about 7% increase, while the increase shown in Table 4 is about 15% for the sample containing 0.9 wt % Mn, and about 20% for the sample containing 1.25 wt % Mn.

TABLE 4

| Example No. | QE (relative) | Decay time | Mn level (wt %) | Notes |
|---|---|---|---|---|
| 5 | 90 | 8.19 ms | 0.94% | Before treatment |
|  | 104.5 | 8.70 ms | 0.90% | After treatment |
| 6 | 80 | 7.95 ms | 1.39% | Before treatment |
|  | 103 | 8.69 ms | 1.25% | After treatment |

Comparative Example 2

A commercial PFS phosphor with a manganese content of 0.70% (as determined by Induced Coupled Plasma) was placed in furnace under a nitrogen (80%) and fluorine (20%) atmosphere at 10 psia and heated at 540° C. for 8 hours. After 8 hours, the temperature was decreased at a rate of 10° C. per minute. The annealed phosphor was washed in a solution of 49% HF saturated with $K_2SiF_6$, dried under vacuum and sifted.

Example 7

Slow Cooling after Annealing

A commercial PFS phosphor with a manganese content of 0.70% (as determined by Induced Coupled Plasma) was placed in furnace under a nitrogen (80%) and fluorine (20%) atmosphere at 10 psia and heated at 540° C. for 8 hours. After 8 hours, the temperature was decreased at a rate of 1° C. per minute. The annealed phosphor was washed in a solution of 49% HF saturated with $K_2SiF_6$, dried under vacuum and sifted.

Stability of the phosphors of Comparative Example 2 and Example 7 was evaluated and compared to an untreated commercial control having manganese content of 0.70%. Results are shown in FIG. 6. It can be seen that % intensity loss of the control (curve A) is greater than 7% after about 10 hours. Annealing improves stability, as shown by Comparative Example 2 (curve B), and using a slow cool down as in Example 7 (curve C) further decreases % intensity loss.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for synthesizing a $Mn^{4+}$ doped phosphor, the process comprising contacting a precursor of formula I, $$A_x(M_{1-z}Mn_z)F_y \qquad \mathrm{I}$$

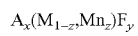

at an elevated temperature with a fluorine-containing oxidizing agent in gaseous form to form the $Mn^{4+}$ doped phosphor;
wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is 1, 2, or 3, and is equal to the absolute value of the charge of the [$MF_y$] ion;
y is 5, 6 or 7; and
$0.03 \le z \le 0.10$.

2. A process according to claim 1, wherein $0.035 \le z \le 0.060$.

3. A process according to claim 1, wherein $0.035 \le z \le 0.0510$.

4. A process according to claim 1, wherein quantum efficiency of the phosphor is at least 8% greater than quantum efficiency of the precursor.

5. A process according to claim 1, wherein quantum efficiency of the phosphor is at least 20% greater than quantum efficiency of the precursor.

6. A process according to claim 1, wherein A is K, M is Si, x is 2, y is 6, and $0.03 \le z \le 0.10$.

7. A process according to claim 1, wherein the temperature is any temperature in a range from about 500° C. to about 600° C.

8. A process according to claim 1, wherein the fluorine-containing oxidizing agent is $F_2$.

9. A process for preparing a $Mn^{4+}$ doped phosphor, the process comprising contacting a precursor at an elevated temperature with a fluorine-containing oxidizing agent in gaseous form, wherein the precursor is selected from the group consisting of
- (A) $A_2[MF_5]:Mn^{4+}$, where A is selected from Li, Na, K, Rb, Cs, and combinations thereof; and
  where M is selected from Al, Ga, In, and combinations thereof;
- (B) $A_3[MF_6]:Mn^{4+}$, where A is selected from Li, Na, K, Rb, Cs, and combinations thereof; and
  where M is selected from Al, Ga, In, and combinations thereof;
- (C) $Zn_2[MF_7]:Mn^{4+}$, where M is selected from Al, Ga, In, and combinations thereof;
- (D) $A[In_2F_7]:Mn^{4+}$ where A is selected from Li, Na, K, Rb, Cs, and combinations thereof;
- (E) $A_2[MF_6]:Mn^{4+}$, where A is selected from Li, Na, K, Rb, Cs, and combinations thereof; and
  where M is selected from Ge, Si, Sn, Ti, Zr, and combinations thereof;
- (F) $E[MF_6]:Mn^{4+}$, where E is selected from Mg, Ca, Sr, Ba, Zn, and combinations thereof; and
  where M is selected from Ge, Si, Sn, Ti, Zr, and combinations thereof;
- (G) $Ba_{0.65}Zr_{0.35}F_{2.70}:Mn^{4+}$; and
- (H) $A_3[ZrF_7]:Mn^{4+}$ where A is selected from Li, Na, K, Rb, Cs, and combinations thereof; and the amount of manganese ranges from about 3.0 mol % to about 10 mol %.

10. A process according to claim 9, wherein the amount of manganese ranges from about 3.5 mol % to about 6.0 mol %.

11. A process according to claim 9, wherein the amount of manganese ranges from about 3.5 mol % to about 5.1 mol %.

12. A process according to claim 9, wherein the amount of manganese ranges from about 3.5 mol % to about 8.0 mol %.

13. A process according to claim 9, wherein quantum efficiency of the phosphor is at least 8% greater than quantum efficiency of the precursor.

14. A process according to claim 9, wherein quantum efficiency of the phosphor is at least 20% greater than quantum efficiency of the precursor.

* * * * *